United States Patent
Bussing et al.

(10) Patent No.: US 10,914,765 B1
(45) Date of Patent: Feb. 9, 2021

(54) MULTI-DIE INTEGRATED CURRENT SENSOR

(71) Applicant: Allegro MicroSystems, LLC, Manchester, NH (US)

(72) Inventors: Wade Bussing, Manchester, NH (US); Alexander Latham, Harvard, MA (US)

(73) Assignee: Allegro MicroSystems, LLC, Manchester, NH (US)

( * ) Notice: Subject to any disclaimer, the term of this patent is extended or adjusted under 35 U.S.C. 154(b) by 0 days.

(21) Appl. No.: 16/527,636

(22) Filed: Jul. 31, 2019

(51) Int. Cl.
    *G01R 15/20*     (2006.01)
    *H01L 43/02*     (2006.01)
    *H01L 43/08*     (2006.01)
    *H01L 43/06*     (2006.01)

(52) U.S. Cl.
    CPC ......... *G01R 15/207* (2013.01); *G01R 15/202* (2013.01); *G01R 15/205* (2013.01); *H01L 43/02* (2013.01); *H01L 43/065* (2013.01); *H01L 43/08* (2013.01)

(58) Field of Classification Search
    CPC .. G01R 15/202; G01R 15/205; G01R 15/207; G01R 15/183; G01R 15/14; G01R 15/20; G01R 19/32; G01R 19/0092; G01R 13/02; G01R 33/18; G01R 33/02; G01R 33/07; G01R 33/0052
See application file for complete search history.

(56) References Cited

U.S. PATENT DOCUMENTS

| | | | |
|---|---|---|---|
| 7,259,545 B2 | 8/2007 | Stauth et al. | |
| 7,598,601 B2 | 10/2009 | Taylor et al. | |
| 7,768,083 B2 | 8/2010 | Doogue et al. | |
| 8,907,437 B2 | 12/2014 | Milano et al. | |
| 9,190,606 B2 | 11/2015 | Liu et al. | |
| 9,529,013 B2 * | 12/2016 | Racz | G01R 15/202 |
| 9,941,224 B2 | 4/2018 | Lamar et al. | |
| 10,049,969 B1 | 8/2018 | Liu | |
| 10,145,904 B2 | 12/2018 | Klebanov et al. | |
| 10,147,688 B2 | 12/2018 | Wilkinson et al. | |

(Continued)

*Primary Examiner* — Thang X Le
(74) *Attorney, Agent, or Firm* — Daly, Crowley, Mofford & Durkee, LLP

(57) ABSTRACT

A current sensor can include a lead frame. The lead frame can include a first lead and a second lead, wherein the first and second leads are coupled together at a first junction region of the lead frame, wherein the current sensor is operable to sense a magnetic field generated by a first current passing through the first junction region. The current sensor can further include a first die disposed proximate to the lead frame. The first die can include a first magnetic field sensing element disposed on a surface of the first die, a first circuit coupled to the first magnetic field sensing element for generating a first signal indicative of a first current, and a first node coupled to the first signal. The current sensor can further include a second die disposed proximate to the lead frame. The second die can include a second magnetic field sensing element disposed on a surface of the second die, a second circuit coupled to the second magnetic field sensing element for generating a second signal indicative of the first current passing through the first junction region or indicative of a second current passing through the lead frame and a second node coupled to the second signal.

23 Claims, 7 Drawing Sheets

(56) References Cited

U.S. PATENT DOCUMENTS

| | | | |
|---|---|---|---|
| 2008/0048642 A1* | 2/2008 | Aratani | G01R 33/077 324/117 H |
| 2014/0167736 A1* | 6/2014 | Suzuki | H01L 24/40 324/117 R |
| 2016/0187388 A1* | 6/2016 | Suzuki | G01R 19/0092 324/244 |
| 2016/0223594 A1* | 8/2016 | Suzuki | G01R 15/20 |
| 2017/0110652 A1* | 4/2017 | Doogue | B82Y 25/00 |
| 2018/0156845 A1* | 6/2018 | Suzuki | G01R 15/207 |

\* cited by examiner

MULTI-DIE INTEGRATED CURRENT SENSOR

CROSS REFERENCE TO RELATED APPLICATIONS

Not Applicable.

STATEMENT REGARDING FEDERALLY SPONSORED RESEARCH

Not Applicable. or

FIELD OF THE INVENTION

This invention relates generally to magnetic field sensors and, more particularly, to a magnetic field sensor in the form of a current sensor that has more than one die.

BACKGROUND

A current sensor is one type of magnetic field sensor that can use a magnetic field sensing element. As is known, an electrical current carried by a conductor generates a magnetic field proximate to the conductor. The magnetic field can be circular around a conductor. The magnetic field generated by the electrical current carried by the conductor can be sensed by a magnetic field sensing element within a current sensor.

Different types of magnetic field sensing elements described below can be sensitive to different directions of magnetic fields.

Some current sensors are used in applications that require a particularly high degree of reliability. For example, current sensors used in automobiles may require a particularly high degree of reliability. Such current sensors used in automobiles include, but are not limited to, current sensors used to sense a current in a main drive motor of an electrical vehicle, current sensors used to detect a current in an electric power steer system (EPS), and current sensors used to detect a current in an electronic braking system.

Thus, it would be desirable to provide a current sensor, in an integrated circuit arrangement, that has a particularly high degree of reliability.

SUMMARY

The present invention provides a current sensor, in an integrated circuit arrangement, that has a particularly high degree of reliability.

In accordance with an example useful for understanding an aspect of the present invention, a current sensor can include a lead frame. The lead frame can include a first lead and a second lead, wherein the first and second leads are coupled together at a first junction region of the lead frame, wherein the current sensor is operable to sense a magnetic field generated by a first current passing through the first junction region. The current sensor can further include a first die disposed proximate to the lead frame. The first die can include a first magnetic field sensing element disposed on a surface of the first die, a first circuit coupled to the first magnetic field sensing element for generating a first signal indicative of a first current, and a first node coupled to the first signal. The current sensor can further include a second die disposed proximate to the lead frame. The second die can include a second magnetic field sensing element disposed on a surface of the second die, a second circuit coupled to the second magnetic field sensing element for generating a second signal indicative of the first current passing through the first junction region or indicative of a second current passing through the lead frame and a second node coupled to the second signal.

In accordance with another example useful for understanding another aspect of the present invention,

BRIEF DESCRIPTION OF THE DRAWINGS

The foregoing features of the invention, as well as the invention itself may be more fully understood from the following detailed description of the drawings, in which.

DETAILED DESCRIPTION

Figure 1A:
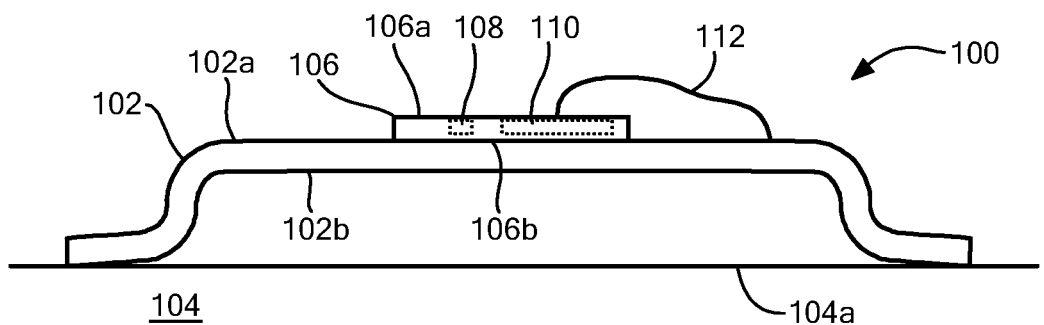
FIGS. 1A-1D are side view drawings showing various arrangements of die within integrated circuits.

Before describing the present invention, some introductory concepts and terminology are explained.

As used herein, the term "magnetic field sensing element" is used to describe a variety of electronic elements that can sense a magnetic field. The magnetic field sensing element can be, but is not limited to, a Hall effect element, a magnetoresistance element, or a magnetotransistor. As is known, there are different types of Hall effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, for example, a spin valve, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of sensitivity perpendicular to a substrate, while metal based or metallic magnetoresistance elements (e.g., GMR, TMR, AMR) and vertical Hall elements tend to have axes of sensitivity parallel to a substrate.

As used herein, the term "magnetic field sensor" is used to describe an assembly that uses one or more magnetic field sensing elements in combination with an electronic circuit, all disposed upon a common substrate, e.g., a semiconductor substrate. Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or a ferromagnetic target (e.g., gear teeth) where the magnetic field sensor is used in combination with a back-biased or other magnet, and a magnetic field sensor that senses a magnetic field density of a magnetic field.

Current sensors are described herein.

The terms "parallel" and "perpendicular" are used in various contexts herein. It should be understood that the terms parallel and perpendicular do not require exact perpendicularity or exact parallelism, but instead it is intended that normal manufacturing tolerances apply, which tolerances depend upon the context in which the terms are used. In some instances, the term "substantially" is used to modify the terms "parallel" or "perpendicular." In general, use of the term "substantially" reflects angles that are beyond manufacturing tolerances, for example, within +/− ten degrees.

As used herein, the term "processor" is used to describe an electronic circuit that performs a function, an operation, or a sequence of operations. The function, operation, or sequence of operations can be hard coded into the electronic circuit or soft coded by way of instructions held in a memory device. A "processor" can perform the function, operation, or sequence of operations using digital values or using analog signals.

In some embodiments, the "processor" can be embodied in an application specific integrated circuit (ASIC), which can be an analog ASIC or a digital ASIC. In some embodiments, the "processor" can be embodied in a microprocessor with associated program memory. In some embodiments, the "processor" can be embodied in a discrete electronic circuit, which can be analog or digital.

As used herein, the term "module" can be used to describe a "processor." However, the term "module" is used more generally to describe any circuit that can transform an input signal into an output signal that is different than the input signal.

A processor can contain internal processors or internal modules that perform portions of the function, operation, or sequence of operations of the processor. Similarly, a module can contain internal processors or internal modules that perform portions of the function, operation, or sequence of operations of the module.

While electronic circuits shown or described in figures herein may be shown or described in the form of analog blocks or digital blocks, it will be understood that the analog blocks can be replaced by digital blocks that perform the same or similar functions and the digital blocks can be replaced by analog blocks that perform the same or similar functions. Analog-to-digital or digital-to-analog conversions may not be explicitly shown in the figures, but should be understood.

As used herein, the term "predetermined," when referring to a value or signal, is used to refer to a value or signal that is set, or fixed, in the factory at the time of manufacture, or by external means, e.g., programming, thereafter. As used herein, the term "determined," when referring to a value or signal, is used to refer to a value or signal that is identified by a circuit during operation, after manufacture.

As used herein, the term "amplifier" is used to describe a circuit element with a gain greater than one, less than one, or equal to one.

As used herein, the term "die" is used to describe a substrate, e.g., a semiconductor substrate, e.g., a silicon substrate, upon which, or within which, active and/or passive circuit elements (e.g., transistors and magnetic field sensing elements) are disposed.

FIGS. 1A-1D are used to describe some types of integrated circuit assemblies. As used herein, the term "integrated circuit" is used to describe a circuit die coupled to a lead frame and packaged in an enclosure, for example, a molded plastic enclosure. Enclosures are not shown in figures herein, but will be understood.

Referring to FIG. 1A, an example of an integrated circuit 100 is described herein as a chip-on-lead (COL) integrated circuit. The COL nomenclature pertains to the integrated circuit 100 having a die 106 disposed over a top surface 102a of a lead frame 102 relative to a surface 104a of a structure 104 (e.g., a fiberglass printed circuit board) on which the integrated circuit 100 is disposed.

The die 106 is shown in a non-flip-chip arrangement for which circuit elements, e.g., one or more magnetic field sensing elements 108 and an electronic circuit 110 (e.g., amplifiers and/or processors), is disposed upon a first surface 106a of the die 106, such that the first surface 106a of the die 106 is distal from the top surface 102a of the lead frame and a second surface 106b of the die 106 is disposed proximate to the top surface 102a of the lead frame 102. Wire bonds 112 can be coupled between the first surface 106a of the die 106 and the lead frame 102 to carry electrical signals to/from the electronic circuit 110 and the lead frame 102.

Figure 1B:
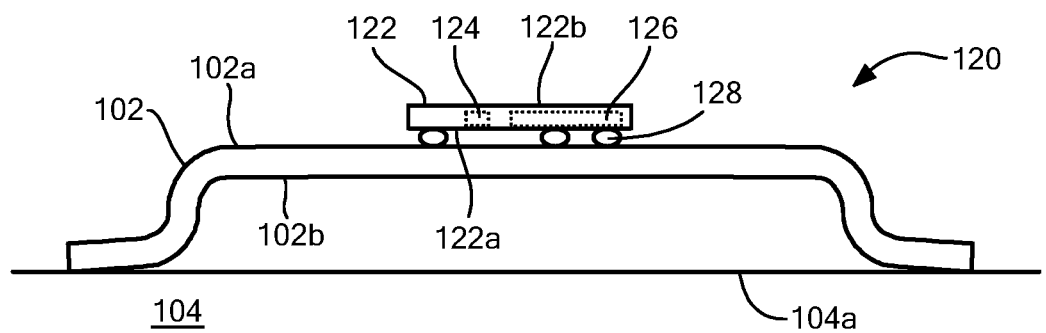

Referring now to FIG. 1B, in which like elements of FIG. 1A are shown having like reference designations, another integrated circuit 120 can be in a chip-on-lead (COL) arrangement. However, here a die 122 can be disposed over the top surface 102a of the lead frame 102 in a flip-chip arrangement. In a flip-chip arrangement, the integrated circuit 120 can include a die 122, wherein circuit elements, e.g., the one or more magnetic field sensing elements 108 and an electronic circuit 126, are disposed upon a first surface 122a of the die 122, such that the first surface 122a of the die 122 is proximate to the top surface 102a of the lead frame and a second surface 122b of the die 122 is distal from the top surface 102a of the lead frame 102. Solder balls 128 or the like can be coupled between the first surface 122a of the die 122 and the top surface 102a of the lead frame 102 to carry electrical signals to/from the electronic circuit 126 and the lead frame 102.

Figure 1C:
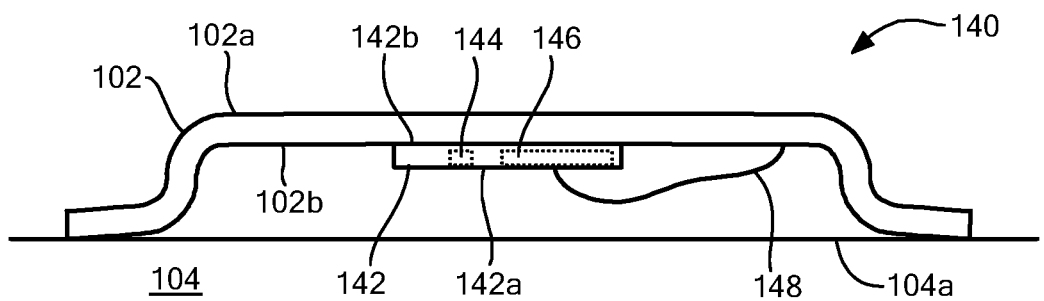

Referring to FIG. 1C, in which like elements of FIGS. 1A and 1B are shown having like reference designations, an example of an integrated circuit 140 is described herein as a lead-on-chip (LOC) integrated circuit. The LOC nomenclature pertains to the integrated circuit 140 having a die 142 disposed under a bottom surface 102b of the lead frame 102 relative to the substrate 104 on which the integrated circuit 140 is disposed.

The die 142 is shown in a non-flip-chip arrangement for which circuit elements, e.g., a magnetic field sensing element 144 and an electronic circuit 146, are disposed upon a first surface 142 (i.e., a surface upon which circuit elements are formed) of the die 142, such that the first surface 142a of the die 142 is distal from the bottom surface 102b of the lead frame and a second surface 142b of the die 142 is disposed proximate to the bottom surface 102b of the lead frame 102. Wire bonds 148 can be coupled between the first surface 142a of the die 142 and the lead frame 102 to carry electrical signals to/from the electronic circuit 146 and the lead frame 102.

Figure 1D:
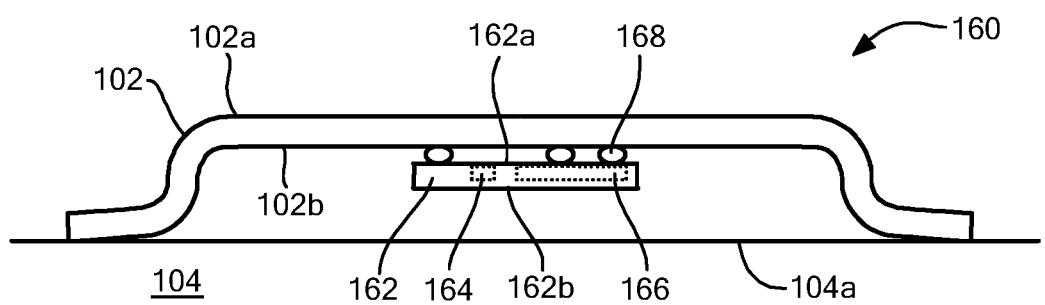

Referring now to FIG. 1D, in which like elements of FIGS. 1A-1C are shown having like reference designations, another integrated circuit 166 can be in a lead-on-chip (LOC) arrangement. However, here a die 162 can be disposed under the bottom surface 102b of the lead frame 102 in a flip-chip arrangement. In a flip-chip arrangement, the integrated circuit 160 can include the die 162, wherein circuit elements, e.g., a magnetic field sensing element 164 and an electronic circuit 166, are disposed upon a first surface 162a of the die 162, such that the first surface 162a of the die 162 is proximate to the bottom surface 102b of the lead frame and a second surface 162b of the die 162 is disposed distal from the bottom surface 102b of the lead frame 102. Solder balls 168 or the like can be coupled between the first surface 162a of the die 162 and the second surface 102b of the lead frame 102 to carry electrical signals to/from the electronic circuit 166 and the lead frame 102.

Figures described below make references to single magnetic field sensing elements disposed upon die. It should be understood that one or more magnetic field sensing elements can be disposed on the die where a single magnetic field sensing element is described.

Figure 2A:
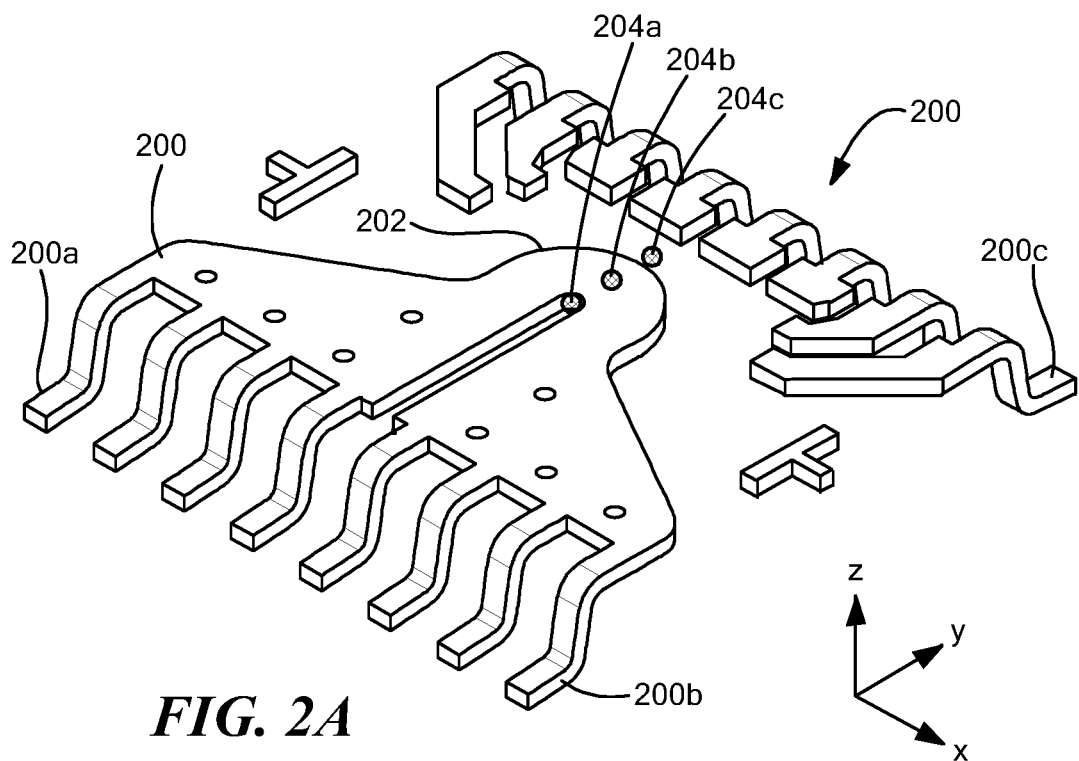
FIG. 2A is a perspective drawing showing an illustrative lead frame having a conductive loop through which a sensed current can flow.

Referring now to FIG. 2A, a lead frame 200 can include a first lead 200a (or a first plurality of leads) electrically coupled to a second lead 200b (or a second plurality of leads) through a conductive loop 202. The conductive loop 202 is shown to be an open loop, e.g., not forming a complete circle.

It will be understood that current flowing between the first lead 200a and the second lead 200b results in a magnetic field proximate to the conductive loop 202. In particular, the magnetic field at a position indicated by point 204a is in a direction substantially parallel to a z-axis, the magnetic field at a position indicated by a point 204b is in a direction substantially parallel to a y-axis, and the magnetic field at a position indicated by a point 204c is in a direction substantially parallel to the z-axis.

From discussion above, it will be understood that a planar Hall element is suitable to detect and measure the magnetic field at the points 204a and 204c, while a magnetoresistance element and a vertical Hall element are suitable to detect and measure the magnetic field at the point 204b. Positions other than the positions 204a, 204b, 204c are also possible.

Magnetic field sensing elements described herein show magnetic field sensing elements at position 204a, and thus, the magnetic field sensing elements can be planar Hall elements. However, other positions and/or other types of magnetic field sensing elements can be used.

Figure 2B:
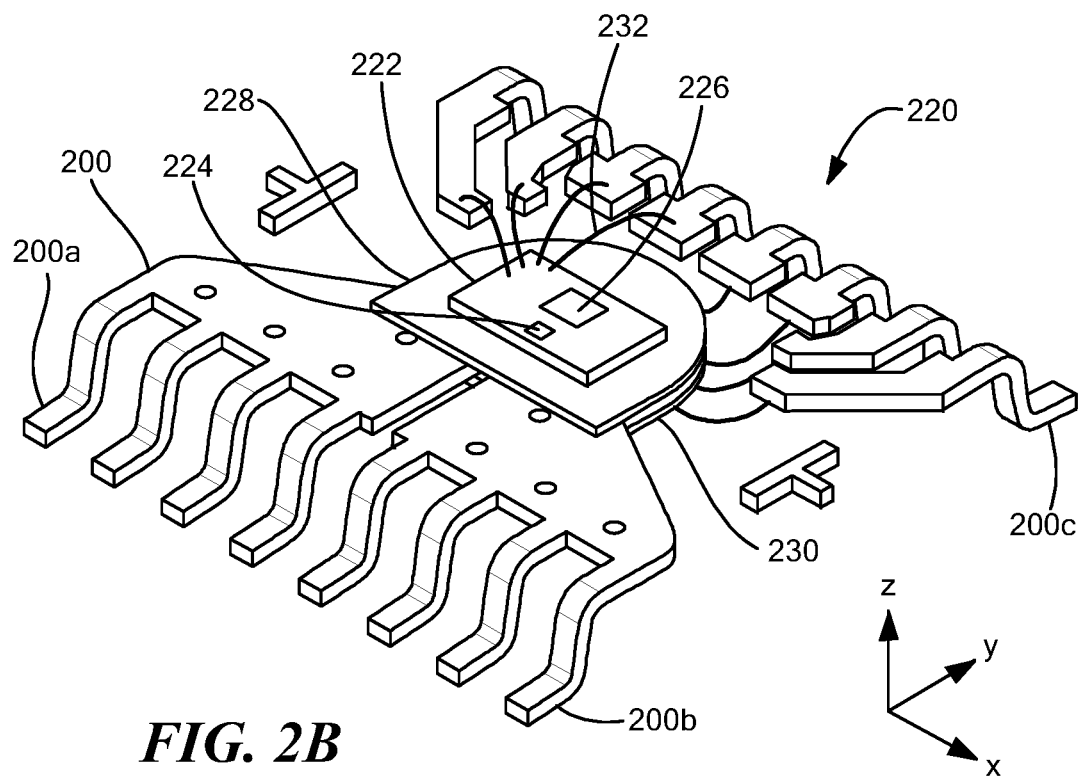
FIG. 2B is a perspective drawings showing an illustrative current sensor having two die disposed on opposite sides of the lead frame of FIG. 2A.
Figure 2C:
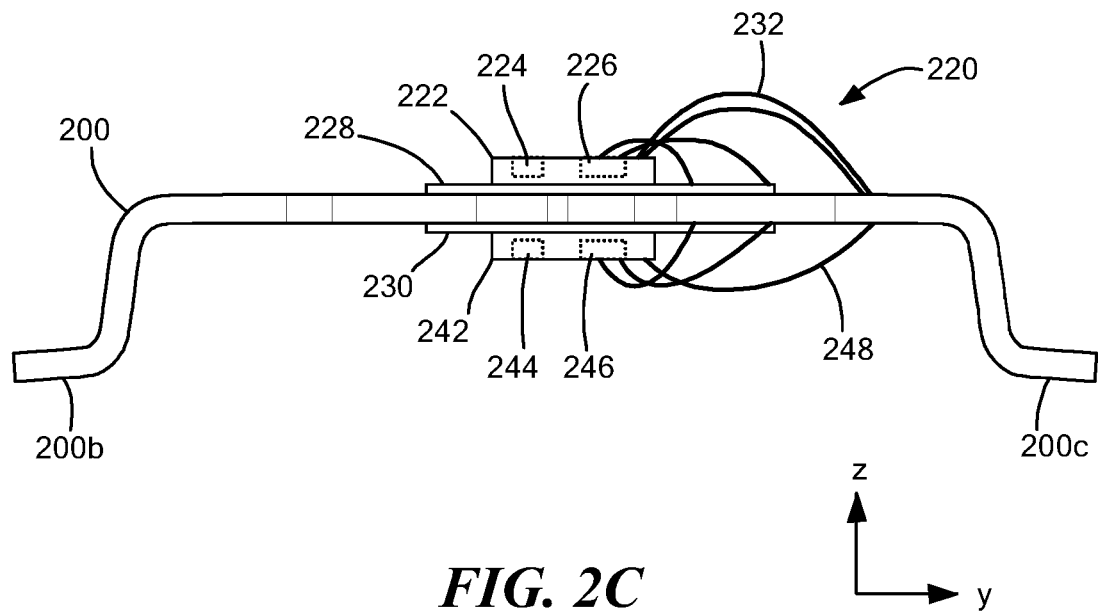
FIG. 2C is a side view drawing showing the illustrative current sensor of FIG. 2B.

Referring now to FIGS. 2B and 2C together, in which like elements of FIG. 2A are shown having like reference designations, an integrated current sensor 220 can include a first die 222 having a surface on which a first magnetic field sensing element 224 and a first electronic circuit 226 can be disposed. The first die 222 can be disposed over a top surface of the lead frame 200 in a chip-on lead (COL) non-flip-chip arrangement. A first insulator 228 can be disposed between the first die 222 and the lead frame 200.

The integrated current sensor 220 can also include a second die 242 having a surface on which a second magnetic field sensing element 244 and a second electronic circuit 246 can be disposed. The second die 242 can be disposed under a bottom surface of the lead frame 200 in a lead-on-chip (LOC) non-flip-chip arrangement. A second insulator 230 can be disposed between the second die 242 and the lead frame 200.

Wire bonds 232 can make electrical connections between the first die 222 and the lead frame 200. Wire bonds 248 can make electrical connections between the second die 242 and the lead frame 200

The first magnetic field sensing element 224 can be disposed near any one of the points 204a, 204b, 204c, depending upon a type of magnetic field sensing element selected. The second magnetic field sensing element 244 can be disposed near any one of points below and aligned in the z-direction with points 204a, 204b, 204c, depending upon a type of magnetic field sensing element selected. In other embodiments, the position of the second magnetic field sensing element 244 does not align in the z-direction with the first magnetic field sensing element 224.

In some embodiments, the first and second die 222, 242 are the same, in which case the two die can both sense the magnetic field generated by a current flowing though the loop 204.

The first electronic circuit 226 can generate a first output signal on the wire bonds 232 that is indicative of the sensed current. The second electronic circuit 246 can generate a second output signal on the wire bonds 248 that is indicative of the sensed current. With this arrangement, the integrated current sensor 220 can provide full redundancy, i.e., able to provide an output signal indicative of the sensed current even if circuits on one of the two die 222, 242 fails.

In other embodiments, the integrated current sensor 220 can determine that a failure of circuits on one of the die 222, 242 has occurred, and can generate an output signal on one of the wire bonds, e.g., wire bonds 232, indicative of the sensed current. In these embodiments, one of the electronic circuits 226, 246 can generate the output signal indicative of the sensed current from one of the first or second die 222, 242, depending upon which die is properly functioning.

Figure 2D:
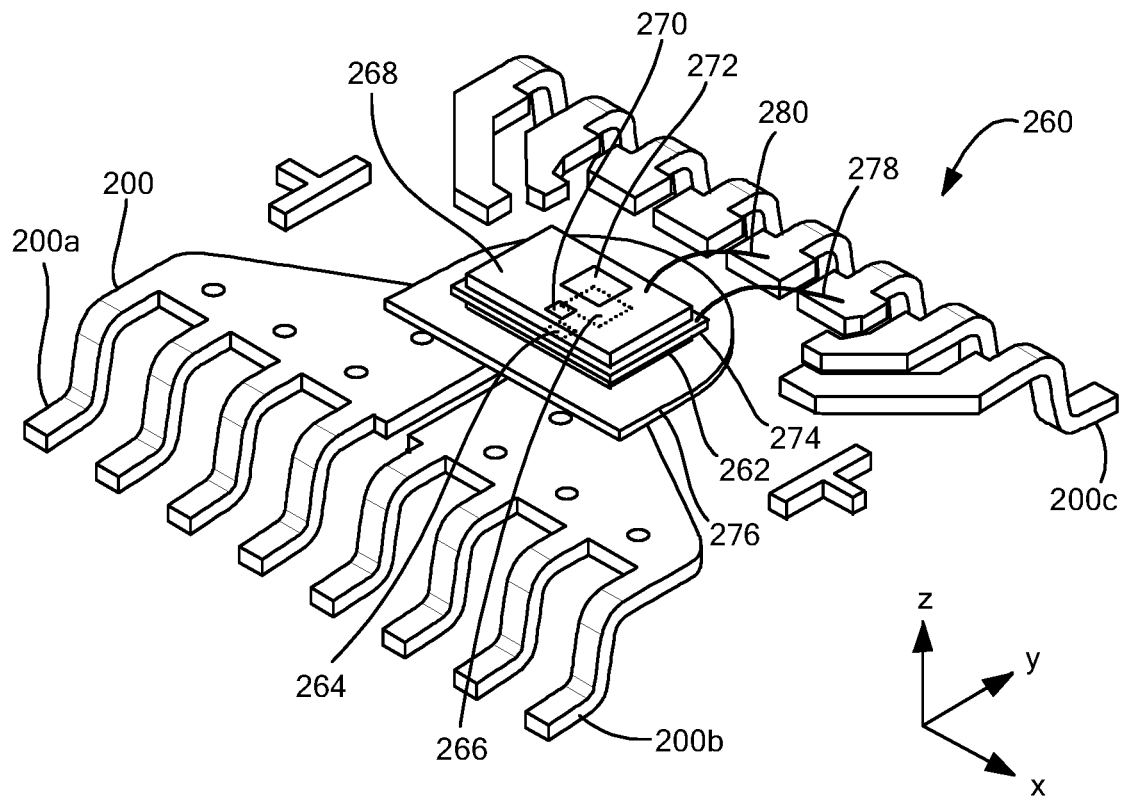
FIG. 2D is a perspective drawing showing an illustrative current sensor having two die disposed on the same side of the lead frame of FIG. 2A in a stacked arrangement.

Referring now to FIG. 2D, in which like elements of FIG. 2A are shown having like reference designations, an integrated current sensor 260 can include the lead frame 200 with first and second die 268, 262 having first and second magnetic field sensing elements 270, 264, respectively, and first and second electronic circuits 272, 266, respectively, disposed thereon or therein.

The first and second die 268, 262 are each disposed in a non-flip chip arrangement such that surfaces of the first and second die 268, 262, respectively upon which, or within which, the first and second magnetic field sensing elements 270, 264, respectively, and the first and second electronic circuits 272, 266, respectively, are oriented upward and away from the lead fame 200.

A first insulator layer 276 can be disposed between the first die 268 and the lead frame 200, and a second insulator layer 274 can be disposed between the first die 268 and the second die 262.

Bond wires, e.g., 280, can provide electrical connections between the first die 268 and the lead frame 200. Bond wires, e.g., 278, can provide electrical connections between the second die 262 and the lead frame 200.

While the first and second die 268, 262, respectively, are shown to have the same size, in other embodiments, the second die 262 can be larger than the first die 268 in order to facilitate coupling of the bond wires 278 to the first die 262. In other embodiments, the first and second die 268, 262 can be the same size but offset from each other in order to facilitate coupling of the bond wires 278 to the first die 262

The first magnetic field sensing element 270 can be disposed near any one of the points 204a, 204b, 204c, depending upon a type of magnetic field sensing element selected. The second magnetic field sensing element 264 can be disposed near any one of points below and aligned in the z-direction with points 204a, 204b, 204c, depending upon a type of magnetic field sensing element selected. In other embodiments, the position of the second magnetic field sensing element 264 does not align in the z-direction with the first magnetic field sensing element 270.

In some embodiments, the first and second die 268, 262 are the same, in which case the two die can both sense the magnetic field generated by a current flowing though the loop 204 of FIG. 2A.

The first electronic circuit 272 can generate a first output signal on the wire bonds 280 that is indicative of the sensed current. The second electronic circuit 266 can generate a second output signal on the wire bonds 278 that is indicative of the sensed current. With this arrangement, the integrated current sensor 260 can provide full redundancy, i.e., able to provide an output signal indicative of the sensed current even if circuits on one of the two die 268, 262 fails.

In other embodiments, the integrated current sensor 260 can determine that a failure of circuits on one of the die 268, 262 has occurred, and can generate and output signal on one of the wire bonds, e.g., wire bonds 278 or wire bond 278 indicative of the sensed current. In these embodiments, one of the electronic circuits 272, 266 can generate the output signal indicative of the sensed current from one of the first or second die 268, 262 depending upon which die is properly functioning.

Figure 3A:
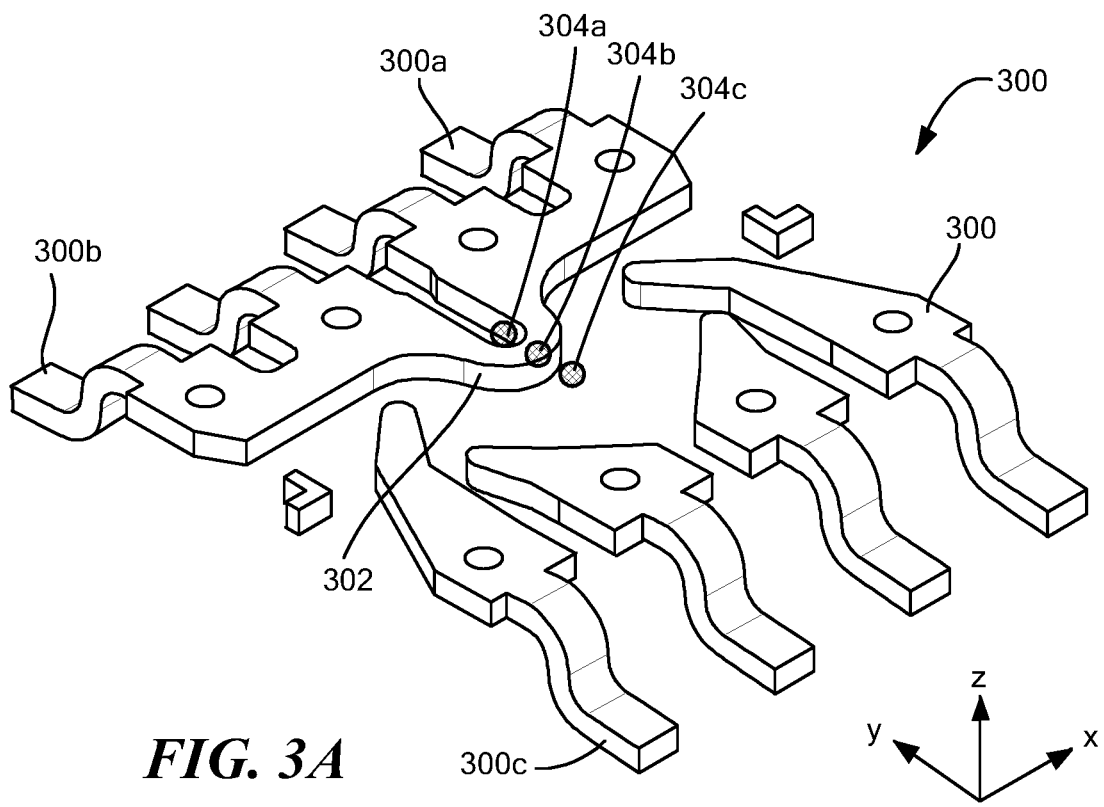
FIG. 3A is a perspective drawing showing another illustrative lead frame having a conductive loop through which a sensed current can flow.

Referring now to FIG. 3A, a lead frame 300 can include a first lead 300a (or a first plurality of leads) electrically coupled to a second lead 300b (or a second plurality of leads) through a conductive loop 302. The conductive loop 302 is shown to be an open loop, e.g., not forming a complete circle.

It will be understood that current flowing between the first lead 300a and the second lead 300b results in a magnetic field proximate to the conductive loop. In particular, the magnetic field at a position indicated by point 304a is in a direction substantially parallel to a z-axis, the magnetic field at a position indicated by a point 304b is in a direction substantially parallel to a y-axis, and the magnetic field at a position indicated by a point 304c is in a direction substantially parallel to the z-axis.

From discussion above, it will be understood that a planar Hall element is suitable to detect and measure the magnetic field at the points 304a and 304c, while a magnetoresistance element and a vertical Hall element are suitable to detect and measure the magnetic field at the point 304b. Positions other than the positions 304a, 304b, 304c are also possible.

Magnetic field sensing elements described herein show magnetic field sensing elements at position 304a, and thus, the magnetic field sensing elements can be planar Hall elements. However, other positions and/or other types of magnetic field sensing elements can be used.

Figure 3B:
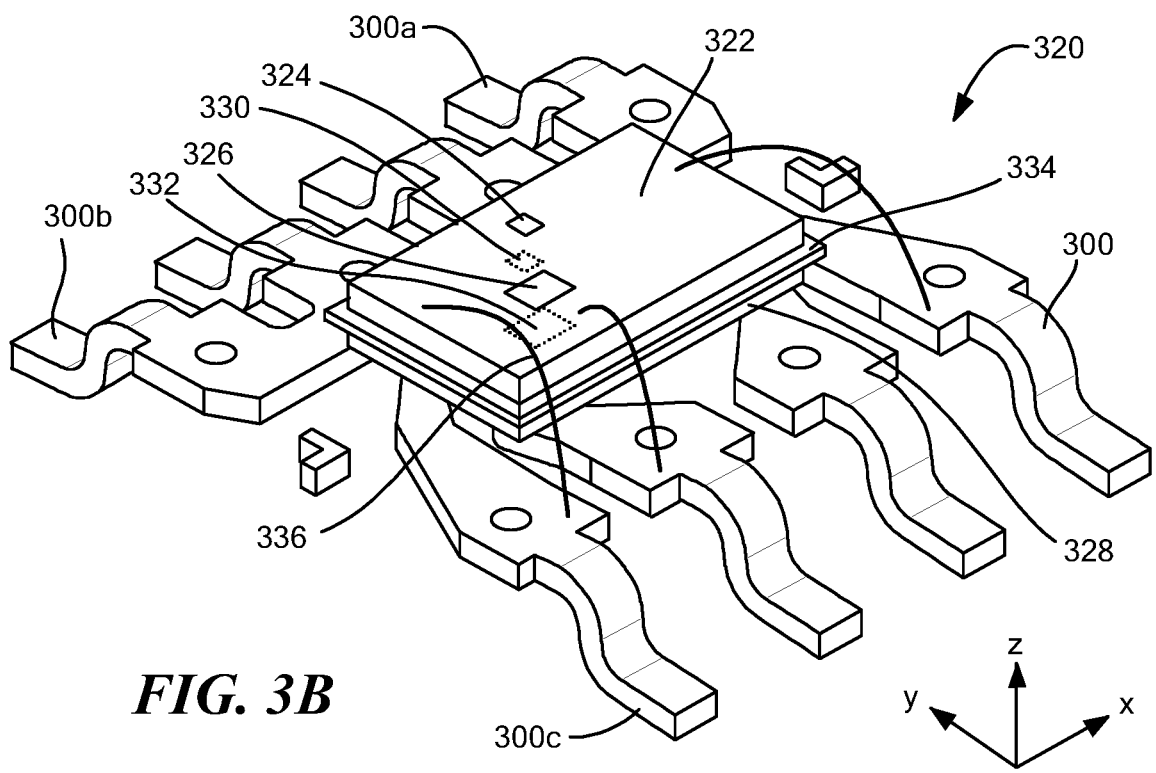
FIG. 3B is a perspective drawings showing an illustrative current sensor having two die disposed over the lead frame of FIG. 3A in a stacked arrangement.
Figure 3C:
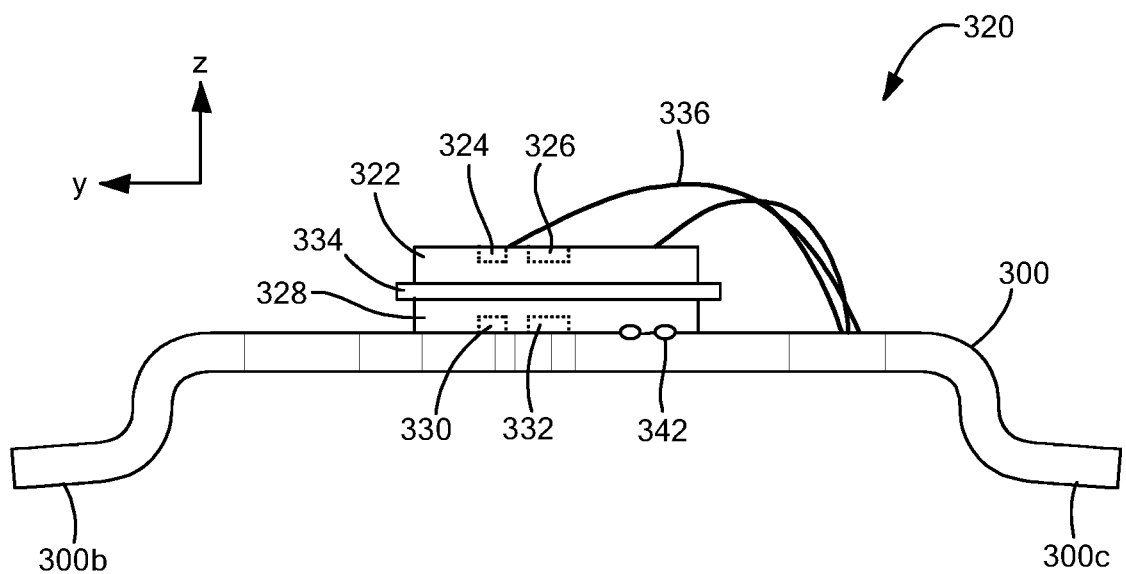
FIG. 3C is a side view drawing showing the illustrative current sensor of FIG. 3B.

Referring now to FIGS. 3B and 3C together, in which like elements of FIG. 3A are shown having like reference designations, an integrated current sensor 320 can include a first die 322 having a surface on which a first magnetic field sensing element 324 and a first electronic circuit 326 can be disposed. The first die 322 can be disposed over a top surface of the lead frame 300 in a chip-on lead (COL) non-flip-chip arrangement.

The integrated current sensor 320 can also include a second die 328 having a surface on which a second magnetic field sensing element 330 and a second electronic circuit 332 can be disposed. The second die 328 can be disposed over a top surface of the lead frame 300 in a chip-on-lead (COL) flip-chip arrangement. An insulator 334 can be disposed between the first die 322 and the second die 328.

Wire bonds 336 can make electrical connections between the first die 322 and the lead frame 300. Solder balls 342 or the like can make electrical connections between the second die 328 and the lead frame 300.

The first magnetic field sensing element 324 can be disposed near any one of the points 304a, 304b, 304c, depending upon a type of magnetic field sensing element selected. The second magnetic field sensing element 330 can be disposed near any one of points below and aligned in the z-direction with points 304a, 304b, 304c, depending upon a type of magnetic field sensing element selected. In other embodiments, the position of the second magnetic field sensing element 330 does not align in the z-direction with the first magnetic field sensing element 324.

In some embodiments, the first and second die 322, 328 are the same, in which case the two die can both sense the magnetic field generated by a current flowing though the loop 302.

The first electronic circuit 326 can generate a first output signal on the wire bonds 336 that is indicative of the sensed current. The second electronic circuit 332 can generate a second output signal on the solder balls 342 that is indicative of the sensed current. With this arrangement, the integrated current sensor 320 can provide full redundancy, i.e., able to provide an output signal indicative of the sensed current even if circuits on one of the two die 322, 328 fails.

In other embodiments, the integrated current sensor 320 can determine that a failure of circuits on one of the die 322, 328 has occurred, and can generate and output signal on one of the wire bonds, e.g., wire bonds 336, or one of the solder balls 342 indicative of the sensed current. In these embodiments, one of the electronic circuits 326, 332 can generate the output signal indicative of the sensed current from one of the first or second die 322, 328, depending upon which die is properly functioning.

Figure 4A:
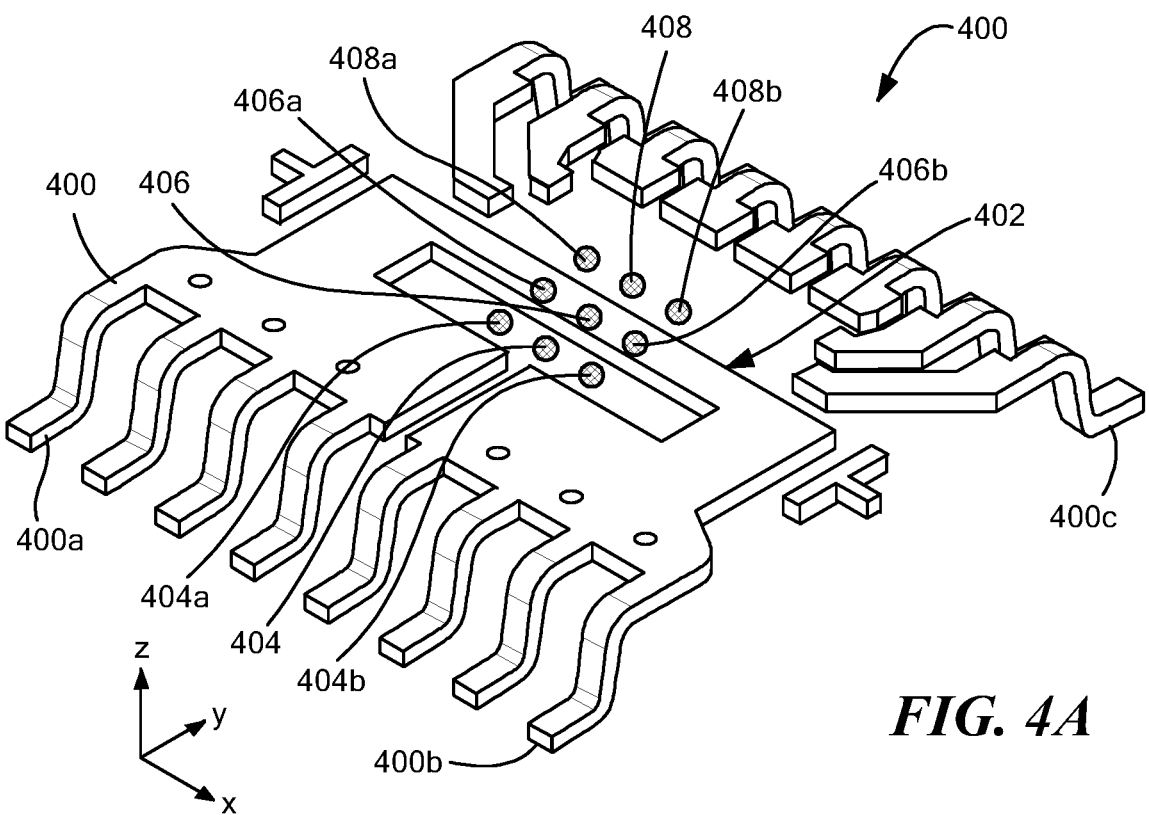
FIG. 4A is a perspective drawing showing another illustrative lead frame having a conductive loop through which a sensed current can flow.

Referring now to FIG. 4A, a lead frame 400 can include a first lead 400a (or a first plurality of leads) electrically coupled to a second lead 400b (or a second plurality of leads) through a conductive loop 402. The conductive loop 402 is shown to be an open loop, e.g., not forming a complete circle.

It will be understood that current flowing between the first lead 400a and the second lead 400b results in a magnetic field proximate to the conductive loop. In particular, the magnetic fields at positions indicated by points 404, 404a, 404b is are in directions substantially parallel to a z-axis, the magnetic fields at positions indicated by points 406, 406a, 406b are in directions substantially parallel to a y-axis, and the magnetic fields at positions indicated by points 408, 408a, 408b are in directions substantially parallel to the z-axis.

From discussion above, it will be understood that a planar Hall element is suitable to detect and measure magnetic fields at the points 404, 404a, 404b and 408, 408a, 408b while a magnetoresistance element and a vertical Hall element are suitable to detect and measure the magnetic fields at the point 406, 406a, 406b. Positions other than the positions 404, 404a, 404b, 406, 406a, 406b, 408, 408a, 408b are also possible.

Magnetic field sensing elements described herein show magnetic field sensing elements at position 404a and 404b and thus, the magnetic field sensing elements can be planar Hall elements. However, other positions and/or other types of magnetic field sensing elements can be used.

Figure 4B:
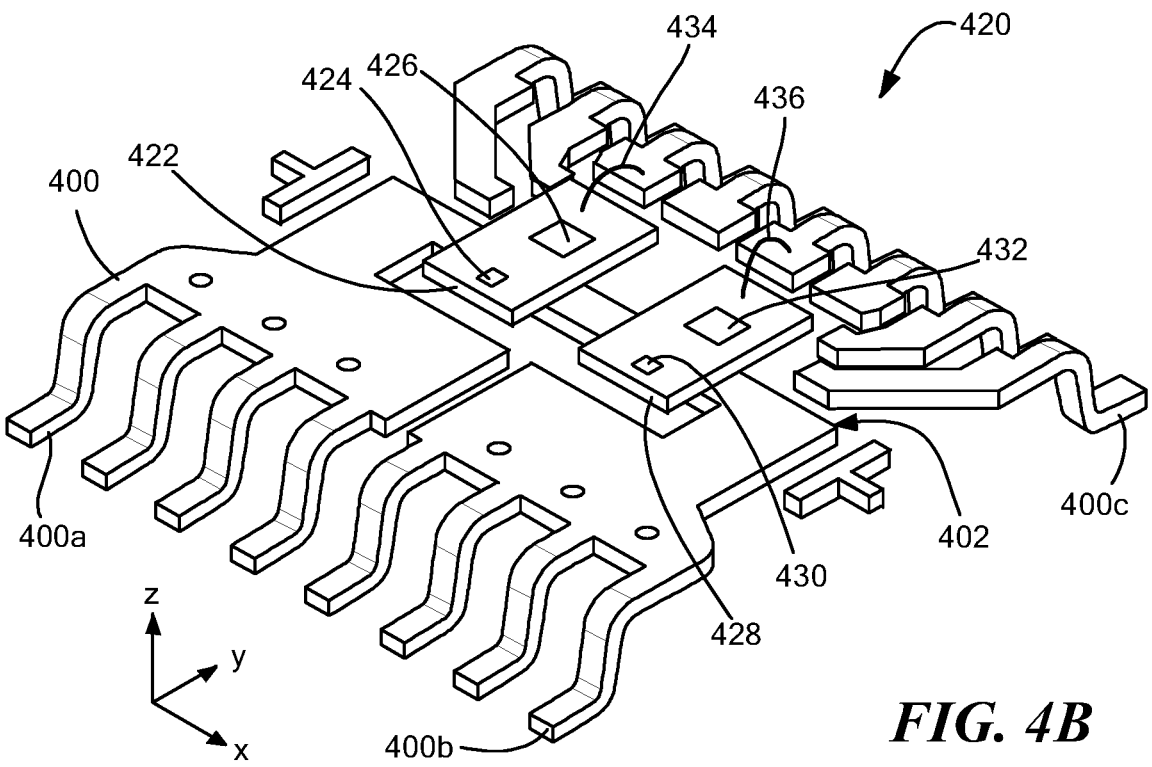
FIG. 4B is a perspective drawings showing an illustrative current sensor having two die disposed over the lead frame of FIG. 4A in a side-by-side arrangement.

Referring now to FIG. 4B, in which like elements of FIG. 4A are shown having like reference designations, an integrated current sensor 420 can include a first die 422 having a surface on which a first magnetic field sensing element 424 and a first electronic circuit 426 can be disposed. The first die 422 can be disposed over a top surface of the lead frame 400 in a chip-on lead (COL) non-flip-chip arrangement.

The integrated current sensor 420 can also include a second die 428 having a surface on which a second magnetic field sensing element 430 and a second electronic circuit 432 can be disposed. The second die 428 can be disposed over a top surface of the lead frame 400 in a chip-on lead (COL) non-flip-chip arrangement.

Wire bonds 434 can make electrical connections between the first die 422 and the lead frame 400. Wire bonds 436 can make electrical connections between the second die 428 and the lead frame 400.

The first magnetic field sensing element 424 can be disposed near any one of the points 404a, 406a, 408a, depending upon a type of magnetic field sensing element selected. The second magnetic field sensing element 440 can be disposed near any one of points 404b, 406b, 408b depending upon a type of magnetic field sensing element selected.

In some embodiments, the first and second die 422, 428 are the same, in which case the two die can both sense the magnetic field generated by a current flowing though the loop 402.

The first electronic circuit 426 can generate a first output signal on the wire bonds 434 that is indicative of the sensed current. The second electronic circuit 432 can generate a second output signal on the wire bond 436 that is indicative of the sensed current. With this arrangement, the integrated current sensor 420 can provide full redundancy, i.e., able to provide an output signal indicative of the sensed current even if circuits on one of the two die 422, 428 fails.

In other embodiments, the integrated current sensor 420 can determine that a failure of circuits on one of the die 422, 428 has occurred, and can generate and output signal on one of the wire bonds 434, 436 indicative of the sensed current. In these embodiments, one of the electronic circuits 426, 432 can generate the output signal indicative of the sensed current from one of the first or second die 422, 428, depending upon which die is properly functioning.

In other embodiments, the first and second die 422, 428 can be disposed over the lead frame 400 in a chip-on-lead (COL) flip chip arrangement and the wire bonds 434, 436 can be replaced by solder balls or the like.

In other embodiments, the first and second die 422, 428 can be disposed under the lead frame 400 in a lead-on-chip (LOC) flip-chip arrangement and the wire bonds 434, 436 can be replaced by solder balls or the like.

In other embodiments, the first and second die 422, 428 can be disposed under the lead frame 400 in a lead-on-chip (LOC) non-flip-chip arrangement using wire bonds similar to the wire bonds 434, 436.

Figure 5A:
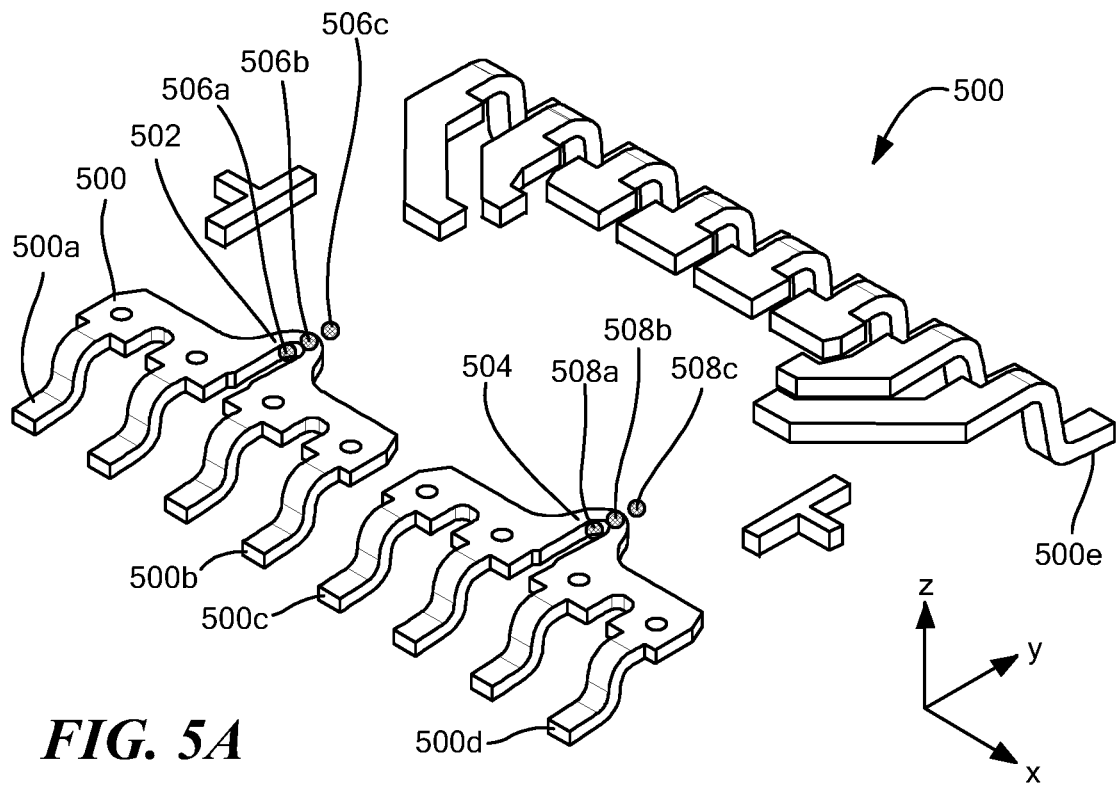
FIG. 5A is a perspective drawing showing another illustrative lead frame having two conductive loops through which two sensed currents can flow.

Referring now to FIG. 5A, a lead frame 500 can include a first lead 500a (or a first plurality of leads) electrically coupled to a second lead 500b (or a second plurality of leads) through a first conductive loop 502. The conductive loop 502 is shown to be an open loop, e.g., not forming a complete circle.

The lead frame 500 can include a third lead 500c (or a third plurality of leads) electrically coupled to a fourth lead 500d (or a fourth plurality of leads) through a second conductive loop 504. The conductive loops 502, 504 are shown to be open loops, e.g., not forming a complete circle.

It will be understood that current flowing between the first lead 500a and the second lead 500b results in a magnetic field proximate to the first conductive loop 502. In particular, the magnetic field at a position indicated by point 506a is in a direction substantially parallel to a z-axis, the magnetic field at a position indicated by a point 506b is in a direction substantially parallel to a y-axis, and the magnetic field at a position indicated by a point 506c is in a direction substantially parallel to the z-axis.

Similarly, current flowing between the third lead 500c and the fourth lead 500d results in a magnetic field proximate to the second conductive loop 504. In particular, the magnetic field at a position indicated by point 508a is in a direction substantially parallel to a z-axis, the magnetic field at a position indicated by a point 508b is in a direction substantially parallel to a y-axis, and the magnetic field at a position indicated by a point 508c is in a direction substantially parallel to the z-axis.

From discussion above, it will be understood that a planar Hall element is suitable to detect and measure the magnetic field at the points 506a, 506c, 508a, 508c, while a magnetoresistance element and a vertical Hall element are suitable to detect and measure the magnetic field at the points 506b and 508b.

Magnetic field sensing elements described herein show magnetic field sensing elements at position 506a, 508a, and thus, the magnetic field sensing elements can be planar Hall elements. However, other positions and other types of magnetic field sensing elements can be used.

Figure 5B:
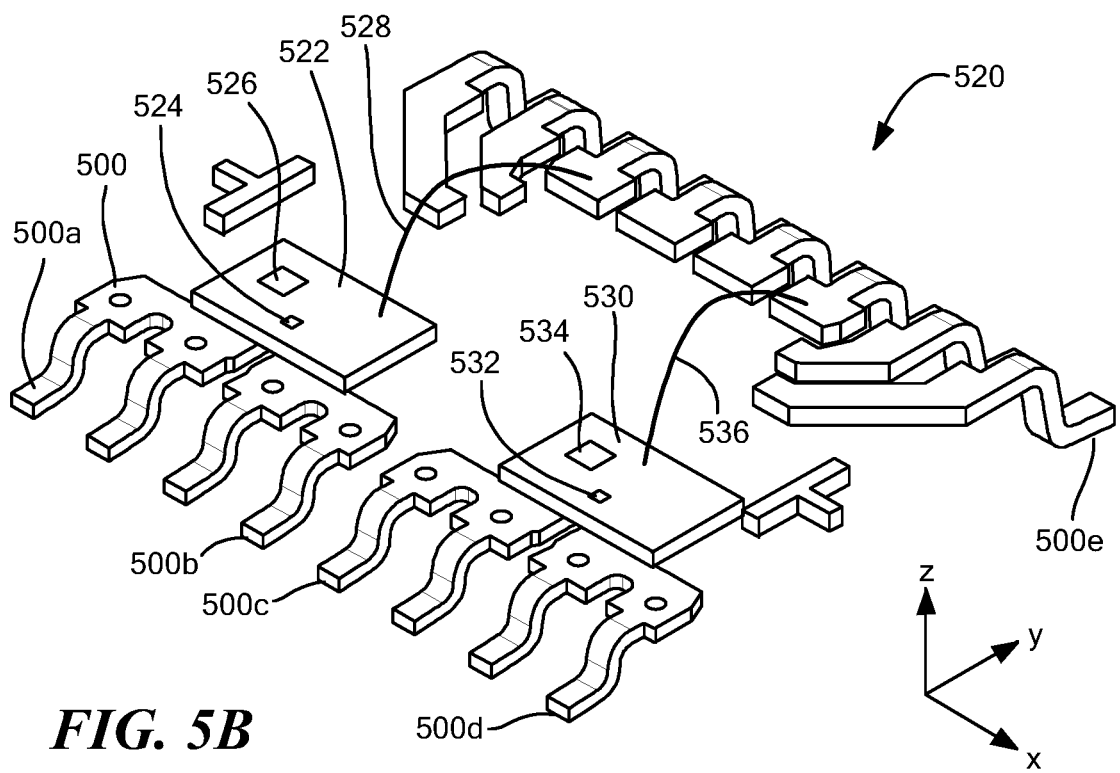
FIG. 5B is a perspective drawings showing an illustrative current sensor having two die disposed over the lead frame of FIG. 5A in a side-by-side arrangement, the two die disposed over respective ones of the two conductive loops.

Referring now to FIG. 5B, in which like elements of FIG. 5A are shown having like reference designations, an integrated current sensor 520 can include a first die 522 having a surface on which a first magnetic field sensing element 524 and a first electronic circuit 526 can be disposed. The first die 522 can be disposed proximate to the first loop 502 over a top surface of the lead frame 500 in a chip-on lead (COL) non-flip-chip arrangement.

The integrated current sensor 520 can also include a second die 530 having a surface on which a second magnetic field sensing element 532 and a second electronic circuit 534 can be disposed. The second die 530 can be disposed proximate to the second loop 504 over a top surface of the lead frame 500 in a chip-on lead (COL) non-flip-chip arrangement.

Wire bonds 528 can make electrical connections between the first die 522 and the lead frame 500. Wire bonds 536 can make electrical connections between the second die 530 and the lead frame 500.

The first magnetic field sensing element 526 can be disposed near any one of the points 506a, 506b, 506c depending upon a type of magnetic field sensing element selected. The second magnetic field sensing element 530 can be disposed near any one of points 508a, 508b, 508c depending upon a type of magnetic field sensing element selected.

In some embodiments, the first and second die 522, 530 are the same, in which case the two die can both sense the magnetic field generated by currents flowing though the loops 502, 504, respectively. Currents flowing through the first and second loops 502, 504 can be the same current or can be different currents. In some embodiments, currents flowing through the first and second loops can have substantially the same amplitude but different phases, for example, as may be two phases of currents flowing in two phases of an electric motor.

The first electronic circuit 526 can generate a first output signal on the wire bonds 528 that is indicative of a first sensed current. The second electronic circuit 532 can generate a second output signal on the wire bond 538 that is indicative of a second sensed current. With this arrangement, the integrated current sensor 520 can provide fault detection in the situation where both sensed currents have substantially the same amplitude but different phases. A detected current amplitude, detected by one of the two electronic circuits 526, 534 that is different than the other one of the two electronic circuits 526, 534 by a difference threshold can be indicative of a fault.

In other embodiments, the first and second die 522, 530 can be disposed over the lead frame 500 in a chip-on-lead (COL) flip chip arrangement and the wire bonds 528, 536 can be replaced by solder balls or the like.

In other embodiments, the first and second die 522, 530 can be disposed under the lead frame 500 in a lead-on-chip (LOC) flip-chip arrangement and the wire bonds 528, 536 can be replaced by solder balls or the like.

In other embodiments, the first and second die 522, 528 can be disposed under the lead frame 500 in a lead-on-chip (LOC) non-flip-chip arrangement using wire bonds similar to the wire bonds 528, 536.

First and second magnetic field sensing element are described in current sensor in embodiments of FIGS. 2-5.

In some embodiments, the first magnetic field sensing elements have a first sensitivity to magnetic fields and the second magnetic field sensing elements have a second sensitivity to magnetic fields, wherein the first sensitivity is at least twenty-fiver percent greater than or less than the second sensitivity.

In some embodiments, at a first circuit node, the current sensors have a first operating range of magnetic fields, and at a second circuit node, the current sensors have a second operating range, wherein the second operating range is at least twenty-five percent greater than or less than the first operating range.

In some embodiments, the first and second magnetic field sensing elements are Hall elements.

In some embodiments, the first and second magnetic field sensing elements are different ones of gallium arsenide Hall elements and silicon Hall elements.

In some embodiments, the first and second magnetic field sensing elements are magnetoresistance elements.

In some embodiments, the first and second magnetic field sensing elements are different ones of magnetoresistance elements and Hall elements.

All references cited herein are hereby incorporated herein by reference in their entirety.

Having described preferred embodiments, which serve to illustrate various concepts, structures and techniques, which are the subject of this patent, it will now become apparent that other embodiments incorporating these concepts, structures and techniques may be used. Accordingly, it is submitted that the scope of the patent should not be limited to the described embodiments but rather should be limited only by the spirit and scope of the following claims.

Elements of embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

What is claimed is:

1. A current sensor, comprising:
   a lead frame, comprising:
      a first lead; and
      a second lead, wherein the first and second leads are coupled together at a first junction region of the lead frame, wherein the current sensor is operable to sense a magnetic field generated by a first current passing through the first junction region, the current sensor further comprising:
   a first die disposed proximate to the lead frame, comprising:
      a first magnetic field sensing element disposed on a surface of the first die; and
      a first circuit coupled to the first magnetic field sensing element for generating a first signal indicative of the first current, the current sensor further comprising:
   a second die disposed proximate to the lead frame, comprising:
      a second magnetic field sensing element disposed on a surface of the second die; and
      a second circuit coupled to the second magnetic field sensing element for generating a second signal indicative of the first current passing through the first junction region or indicative of a second current passing through the lead frame;
   wherein the first die is disposed over the first junction region in a non-flip-chip chip-on-lead arrangement and the second die is disposed under the first junction region in a non-flip-chip lead-on chip arrangement, wherein the lead frame is disposed between the first die and the second die.

2. The current sensor of claim 1, wherein the lead frame further comprises a third lead and a fourth lead, the current sensor further comprising:
   a first conductive structure coupled to the third lead; and
   a second conductive structure coupled to the fourth lead.

3. The current sensor of claim 1, wherein the first die and the second die are coupled with wire bonds to the lead frame.

4. The current sensor of claim 1, further comprising:
   a first insulating layer disposed between the first junction region and the first die; and
   a second insulating layer disposed between the first junction region and the second die.

5. The current sensor of claim 1, wherein the lead frame further comprises:
   a third lead;

a fourth lead, wherein the third and fourth leads are coupled together at a second junction region of the lead frame, wherein the second circuit coupled to the second magnetic field sensing element is for generating the second signal indicative of the second current passing through the second junction region of the lead frame.

6. The current sensor of claim 1, wherein the first die and the second die are coupled with wire bonds to the lead frame.

7. The current sensor of claim 1, wherein the first magnetic field sensing element has a first sensitivity to magnetic fields and the second magnetic field sensing element has a second sensitivity to magnetic fields, wherein the first sensitivity is at least twenty-five percent greater than or less than the second sensitivity.

8. The current sensor of claim 7, wherein, the current sensor has a first operating range of magnetic fields, and wherein, the current sensor has a second operating range, wherein the second operating range is at least twenty-five percent greater than or less than the first operating range.

9. The current sensor of claim 7, wherein the first and second magnetic field sensing elements are Hall elements.

10. The current sensor of claim 7, wherein the first and second magnetic field sensing elements are different ones of a gallium arsenide Hall element and a silicon Hall element.

11. The current sensor of claim 7, wherein the first and second magnetic field sensing elements are magnetoresistance elements.

12. The current sensor of claim 7, wherein the first and second magnetic field sensing elements are different ones of a magnetoresistance element and a Hall element.

13. A current sensor, comprising:
a lead frame, comprising:
a first lead; and
a second lead, wherein the first and second leads are coupled together at a first junction region of the lead frame, wherein the current sensor is operable to sense a magnetic field generated by a first current passing through the first junction region, the current sensor further comprising:
a first die disposed proximate to the lead frame, comprising:
a first magnetic field sensing element disposed on a surface of the first die; and
a first circuit coupled to the first magnetic field sensing element for generating a first signal indicative of the first current, the current sensor further comprising:
a second die disposed proximate to the lead frame, comprising:
a second magnetic field sensing element disposed on a surface of the second die; and
a second circuit coupled to the second magnetic field sensing element for generating a second signal indicative of the first current passing through the first junction region or indicative of a second current passing through the lead frame;
wherein the lead frame further comprises a third lead, wherein the first circuit further comprises a multiplexer operable to select one of the first signal or the second signal to generate a third signal as the selected one of the first signal or the second signal.

14. The current sensor of claim 13, wherein the first die is disposed in a non-flip-chip chip-on-lead arrangement, and the second die is coupled to the lead frame in a flip-chip chip-on-lead arrangement.

15. The current sensor of claim 14, further comprising:
an insulating layer disposed between the first die and the second die.

16. The current sensor of claim 13, wherein the first die and the second die are coupled with wire bonds to the lead frame.

17. The current sensor of claim 13, wherein the first die is coupled to the lead frame in a non-flip-chip lead-on-chip arrangement, and the second die is coupled to the lead frame in a non-flip-chip lead-on-chip arrangement.

18. A current sensor, comprising:
a lead frame, comprising:
a first lead; and
a second lead, wherein the first and second leads are coupled together at a first junction region of the lead frame, wherein the current sensor is operable to sense a magnetic field generated by a first current passing through the first junction region, the current sensor further comprising:
a first die disposed proximate to the lead frame, comprising:
a first magnetic field sensing element disposed on a surface of the first die; and
a first circuit coupled to the first magnetic field sensing element for generating a first signal indicative of the first current, the current sensor further comprising:
a second die disposed proximate to the lead frame, comprising:
a second magnetic field sensing element disposed on a surface of the second die; and
a second circuit coupled to the second magnetic field sensing element for generating a second signal indicative of the first current passing through the first junction region or indicative of a second current passing through the lead frame;
wherein the first die is disposed in a non-flip-chip chip-on-lead arrangement and the second die is coupled to the lead frame in a non-flip-chip chip-on-lead arrangement, wherein the lead frame is disposed under the first die and the second die, wherein the first die and the second die are disposed over the first junction region.

19. The current sensor of claim 18, wherein the first die and the second die are coupled with wire bonds to the lead frame.

20. The current sensor of claim 18, further comprising:
a first insulating layer disposed between the first die and the second die; and
a second insulating layer disposed between the first junction region and the second die.

21. The current sensor of claim 18, wherein the second die is disposed over the first die.

22. The current sensor of claim 21, wherein the first die is coupled with wire bonds to the lead frame and the second die is coupled to the lead frame with solder balls.

23. The current sensor of claim 18, wherein the second die is disposed side by side with the first die over the first junction region.

* * * * *

UNITED STATES PATENT AND TRADEMARK OFFICE
CERTIFICATE OF CORRECTION

PATENT NO. : 10,914,765 B1
APPLICATION NO. : 16/527636
DATED : February 9, 2021
INVENTOR(S) : Wade Bussing et al.

It is certified that error appears in the above-identified patent and that said Letters Patent is hereby corrected as shown below:

In the Specification

Column 1, Line 12 delete "Not Applicable. or" and replace with --Not Applicable.--.

Column 2, Line 19 delete "drawings" and replace with --drawing--.

Column 2, Line 30 delete "drawings" and replace with --drawing--.

Column 2, Line 38 delete "drawings" and replace with --drawing--.

Column 2, Line 44 delete "drawings" and replace with --drawing--.

Column 6, Line 41 delete "though" and replace with --through--.

Column 7, Line 34 delete "though" and replace with --through--.

Column 7, Line 46 delete "generate and output" and replace with --generate an output--.

Column 8, Line 43 delete "though" and replace with --through--.

Column 8, Line 55 delete "and output" and replace with --an output--.

Column 9, Line 5 delete "is are in" and replace with --are in--.

Column 9, Line 50 delete "though" and replace with --through--.

Column 9, Line 62 delete "and output" and replace with --an output--.

Signed and Sealed this
Third Day of May, 2022

*Katherine Kelly Vidal*
Katherine Kelly Vidal
*Director of the United States Patent and Trademark Office*

CERTIFICATE OF CORRECTION (continued)
U.S. Pat. No. 10,914,765 B1

Column 11, Line 47 delete "element" and replace with --elements--.

Column 11, Line 53 delete "twenty-fiver" and replace with --twenty-five--.